US012620562B2

(12) United States Patent
Huang et al.

(10) Patent No.: US 12,620,562 B2
(45) Date of Patent: May 5, 2026

(54) FOCUS RING FOR A PLASMA-BASED SEMICONDUCTOR PROCESSING TOOL

(71) Applicant: Taiwan Semiconductor Manufacturing Company, Ltd., Hsinchu (TW)

(72) Inventors: Sheng-Chieh Huang, Hsinchu (TW); Chang Kuang Tso, Hsinchu (TW); Chou Feng Lee, Hsinchu County (TW); Chung-Hsiu Cheng, Banqiao (TW); Jr-Sheng Chen, Hsinchu (TW); Chun Yan Chen, Zhubei (TW); Chih-Hsien Hsu, Hsinchu (TW); Chin-Tai Hung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,410

(22) Filed: Aug. 10, 2023

(65) Prior Publication Data

US 2023/0386799 A1 Nov. 30, 2023

Related U.S. Application Data

(62) Division of application No. 17/446,399, filed on Aug. 30, 2021.

(51) Int. Cl.
*H01J 37/32* (2006.01)
*H01L 21/3065* (2006.01)

(52) U.S. Cl.
CPC .... *H01J 37/32642* (2013.01); *H01L 21/3065* (2013.01); *H01J 2237/3343* (2013.01)

(58) Field of Classification Search
CPC .............. C23C 16/227; C23C 16/4585; H01L 21/3065; H01L 21/6831; H01L 21/68714;
(Continued)

(56) References Cited

U.S. PATENT DOCUMENTS

| | | | | | |
|---|---|---|---|---|---|
| 5,498,313 | A | * | 3/1996 | Bailey | H01J 37/32623 118/723 E |
| 5,529,657 | A | * | 6/1996 | Ishii | H01J 37/32642 156/915 |

(Continued)

*Primary Examiner* — Gordon Baldwin
*Assistant Examiner* — Joshua Reyes
(74) *Attorney, Agent, or Firm* — Harrity & Harrity, LLP

(57) ABSTRACT

A focus ring for a plasma-based semiconductor processing tool is designed to provide and/or ensure etch rate uniformity across a wafer during a plasma etch process. The focus ring may include an angled inner wall that is angled away from a center of the focus ring to direct a plasma toward the wafer. The angle of the angled inner wall may be greater than approximately 130 degrees relative to the top surface of the wafer and/or may be less than approximately 50 degrees relative to an adjacent lower surface of the focus ring to reduce and/or eliminate areas of overlapping plasma on the wafer (which would otherwise cause non-uniform etch rates). Moreover, an inner diameter may be configured to be in a range of approximately 209 millimeters to 214 millimeters to further reduce and/or eliminate areas of overlapping plasma on the wafer. In this way, the focus ring provides and/or increases etch rate uniformity across the wafer, which may reduce structural variations across semiconductor devices being formed on the wafer and/or may increase processing yield.

20 Claims, 7 Drawing Sheets

(58) Field of Classification Search
CPC .......... H01L 21/68735; H01J 37/32091; H01J
37/321; H01J 37/32623; H01J 37/32642
See application file for complete search history.

(56) References Cited

U.S. PATENT DOCUMENTS

| | | | |
|---|---|---|---|
| 6,074,518 A | 6/2000 | Imafuku et al. | |
| 6,257,168 B1 | 7/2001 | Ni et al. | |
| 6,284,093 B1 | 9/2001 | Ke et al. | |
| 6,296,712 B1 | 10/2001 | Guo et al. | |
| 6,344,105 B1* | 2/2002 | Daugherty | H01L 21/68735 |
| | | | 156/915 |
| 2002/0100554 A1* | 8/2002 | Han | H01J 37/32467 |
| | | | 156/345.1 |
| 2004/0173319 A1* | 9/2004 | Suzuki | H01L 21/67069 |
| | | | 156/345.51 |
| 2008/0236749 A1 | 10/2008 | Koshimizu et al. | |
| 2009/0221150 A1 | 9/2009 | Hammond, IV et al. | |
| 2010/0059181 A1* | 3/2010 | Lee | H01J 37/32623 |
| | | | 156/345.51 |
| 2010/0218785 A1 | 9/2010 | Green et al. | |
| 2013/0055952 A1 | 3/2013 | Subramani et al. | |
| 2015/0001180 A1* | 1/2015 | Doan | H01J 37/32623 |
| | | | 156/345.1 |
| 2015/0247237 A1* | 9/2015 | Ha | H01J 37/32091 |
| | | | 118/715 |
| 2016/0211166 A1* | 7/2016 | Yan | H01J 37/023 |
| 2017/0040199 A1 | 2/2017 | Tsuji et al. | |
| 2017/0178872 A1 | 6/2017 | Kishi et al. | |
| 2018/0286640 A1 | 10/2018 | Cue et al. | |
| 2018/0294146 A1 | 10/2018 | Kumar et al. | |
| 2019/0348315 A1 | 11/2019 | Tanikawa | |
| 2020/0185256 A1* | 6/2020 | Nguyen | H01J 37/32623 |
| 2020/0234928 A1 | 7/2020 | Vishwanath | |
| 2020/0258753 A1 | 8/2020 | Lee et al. | |
| 2020/0286737 A1* | 9/2020 | Nagaiwa | H01L 21/683 |
| 2020/0365378 A1* | 11/2020 | Kellogg | H01J 37/32807 |
| 2021/0104383 A1* | 4/2021 | Sasaki | H01J 37/32091 |
| 2023/0066418 A1 | 3/2023 | Huang et al. | |

* cited by examiner

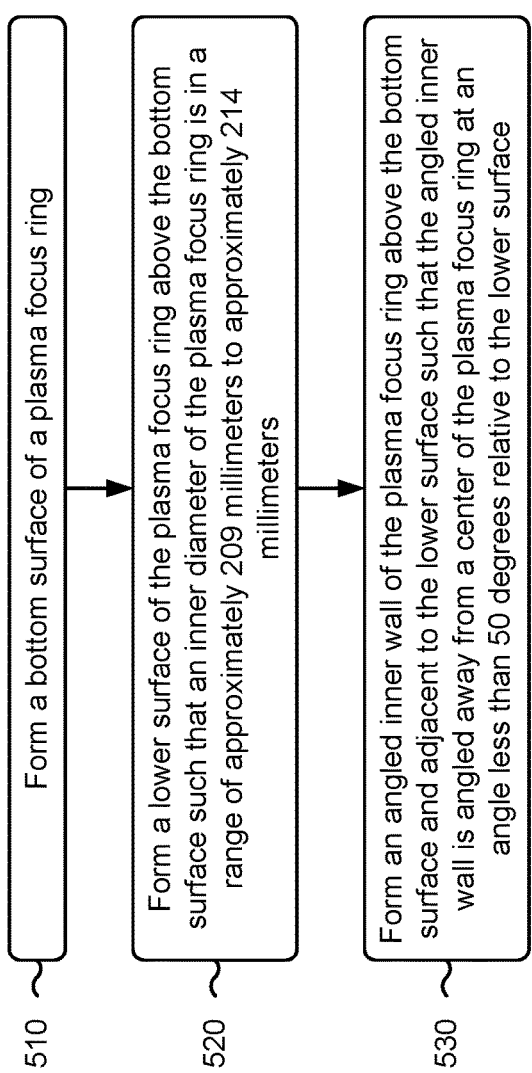

Form a bottom surface of a plasma focus ring

510

Form a lower surface of the plasma focus ring above the bottom surface such that an inner diameter of the plasma focus ring is in a range of approximately 209 millimeters to approximately 214 millimeters

520

Form an angled inner wall of the plasma focus ring above the bottom surface and adjacent to the lower surface such that the angled inner wall is angled away from a center of the plasma focus ring at an angle less than 50 degrees relative to the lower surface

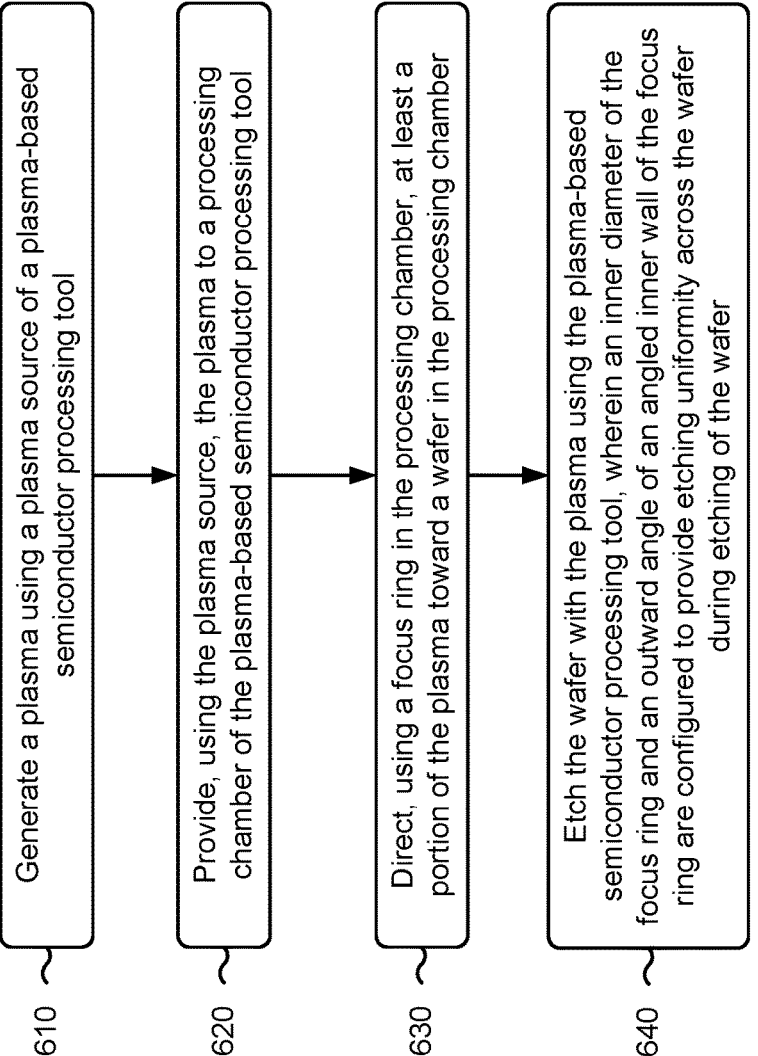

610 Generate a plasma using a plasma source of a plasma-based semiconductor processing tool 620 Provide, using the plasma source, the plasma to a processing chamber of the plasma-based semiconductor processing tool 630 Direct, using a focus ring in the processing chamber, at least a portion of the plasma toward a wafer in the processing chamber 640 Etch the wafer with the plasma using the plasma-based semiconductor processing tool, wherein an inner diameter of the focus ring and an outward angle of an angled inner wall of the focus ring are configured to provide etching uniformity across the wafer during etching of the wafer

FOCUS RING FOR A PLASMA-BASED SEMICONDUCTOR PROCESSING TOOL

RELATED APPLICATION

This application is a divisional of U.S. patent application Ser. No. 17/446,399, filed Aug. 30, 2021, which is incorporated herein by reference in its entirety.

BACKGROUND

A plasma-based semiconductor processing tool may be used to etch various types of semiconductor materials from a substrate. Examples of plasma-based semiconductor processing tools include a decoupled plasma source (DPS) tool, an inductively coupled plasma (ICP) tool, and a transformer coupled plasma (TCP) tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flowchart of an example process relating to forming a focus ring for a plasma-based semiconductor processing tool.

FIG. 6 is a flowchart of an example process relating to etching a wafer using a focus ring in a plasma-based semiconductor processing tool.

DETAILED DESCRIPTION

Figure 1:
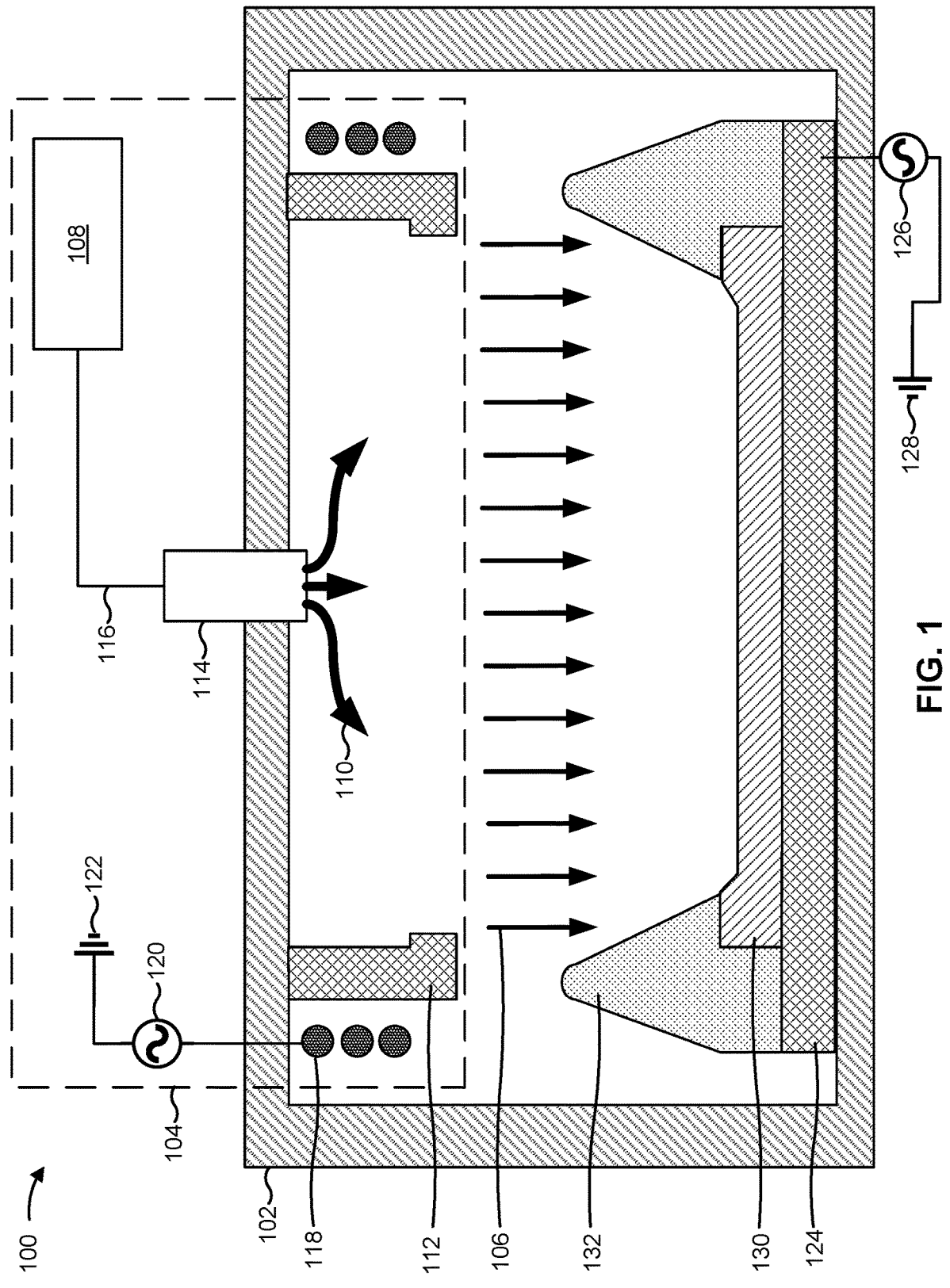
FIG. 1 is a diagram of an example plasma-based semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A plasma-based semiconductor processing tool may include various components such as a processing chamber, a plasma source including processing gas supplying components and plasma generating components, a chuck to hold a wafer in the processing chamber, and an electrode below the chuck to attract plasma ions in the processing chamber toward the wafer. In some cases, the plasma directed toward the wafer may be uneven and/or non-uniform. For example, a greater density of plasma ions may be directed toward the center of the wafer relative to the outer areas of the wafer toward the edge of the wafer. This can result in non-uniform etch rates across the wafer, which can cause some areas of the wafer to be etched faster than other areas of the wafer. Non-uniform etch rates across the wafer can result in non-uniform layer thicknesses and/or non-uniform semiconductor device feature sizes across the wafer, which can result in structural variations across semiconductor devices being formed on the wafer. Moreover, in some cases, non-uniform etch rates across the wafer can lead to over-etching in some areas of a wafer, which can destroy some of the semiconductor devices being formed thereon, thereby reducing processing yield.

Some implementations described herein provide a focus ring for a plasma-based semiconductor processing tool. The focus ring may be placed around a chuck that is configured to hold a wafer in a processing chamber of the plasma-based semiconductor processing tool. The wafer may be placed on the chuck such that the focus ring surrounds the wafer. The focus ring is designed to provide and/or ensure etch rate uniformity across the wafer during a plasma etch process. For example, the focus ring may include an angled inner wall that is angled away from a center of the focus ring to direct a plasma toward the wafer. The angle of the angled inner wall may be greater than approximately 130 degrees relative to the top surface of the wafer and/or may be less than approximately 50 degrees relative to an adjacent lower surface of the focus ring to reduce and/or eliminate areas of overlapping plasma on the wafer (which would otherwise cause non-uniform etch rates). Moreover, an inner diameter may be configured to be in a range of approximately 209 millimeters to approximately 214 millimeters to further reduce and/or eliminate areas of overlapping plasma on the wafer. In this way, the focus ring provides and/or increases etch rate uniformity across the wafer, which may reduce structural variations across semiconductor devices being formed on the wafer and/or may increase processing yield.

FIG. 1 is a diagram of an example plasma-based semiconductor processing tool 100 described herein. In particular, FIG. 1 is a cross-sectional view of the plasma-based semiconductor processing tool 100. The plasma-based semiconductor processing tool 100 may be a plasma etch tool, which may be a type of dry etch tool that uses plasma ions to etch or remove portions of a wafer or layers/structures formed thereon. In some implementations, the plasma-based semiconductor processing tool 100 is a plasma etch tool for etching metals on a wafer. In some implementations, the plasma-based semiconductor processing tool 100 is a decoupled plasma source (DPS) tool, an inductively coupled plasma (ICP) tool, a transformer coupled plasma (TCP) tool, or another type of plasma etch tool.

As shown in FIG. 1 the plasma-based semiconductor processing tool 100 may include a processing chamber 102. The processing chamber 102 may include a chamber that is capable of being hermitically sealed so that the processing chamber 102 can be pressurized (e.g., to a vacuum or a partial vacuum). In some implementations, the processing chamber 102 is sized to accommodate a particular size of wafer such as a 200 millimeter wafer. In some implementations, the processing chamber 102 is sized to accommodate various sizes of wafers, such as a 150 millimeter wafer, a 200 millimeter wafer, a 300 millimeter wafer, and/or another sized wafer.

As further shown in FIG. 1, the plasma-based semiconductor processing tool 100 may include a plasma source 104 that is configured to generate a plasma 106 and provide or supply the plasma 106 to the processing chamber 102. The plasma source 104 may include a process gas source 108 to provide a semiconductor process gas 110 (e.g., argon or another type of processing gas) to a reaction chamber 112 in the processing chamber 102. The process gas source 108 may provide the semiconductor process gas 110 to the reaction chamber 112 through an inlet port 114 via a supply line 116.

The plasma source 104 may further include a coiled conductor 118 surrounding the reaction chamber 112. The coiled conductor 118 may include a copper conductor or another type of conductor formed of a conductive material that is coiled around the reaction chamber 112 and connected to a radio frequency (RF) source 120. The RF source 120 may be referred to a plasma RF source in that the RF source 120 provides or supplies an RF or alternating current to the coiled conductor 118 to generate the plasma 106 from the semiconductor process gas 110. The RF source 120 may connect to an electrical ground 122 and may be an RF power supply or another type of device that is capable of generating and providing/supplying an RF or alternating current in a suitable frequency range such as approximately 10 megahertz (MHz) to approximately 30 MHz or approximately 300 MHz to approximately 300 gigahertz (GHz) (e.g., a microwave frequency range), among other examples.

To generate the plasma 106, the RF source 120 may provide the RF or alternating current to the coiled conductor 118. The RF or alternating current may traverse through and/or along the coiled conductor 118, which generates a time-varying electromagnetic field in the reaction chamber 112 through electromagnetic induction. The time-varying electromagnetic field in the reaction chamber 112 may create an electromotive force in the semiconductor process gas 110, which energizes the semiconductor process gas 110 with electrons, thereby forming the plasma 106.

The plasma 106 may be provided or supplied to the processing chamber 102 through one or more openings in the reaction chamber 112. In some implementations, the plasma 106 is provided or supplied to the processing chamber 102 through one or more additional components, such as a showerhead, a quartz dome, and/or another component.

As further shown in FIG. 1, an electrode 124 may be located in the processing chamber 102 (e.g., at a side of the processing chamber 102 opposing the plasma source 104). The electrode 124 may be connected to an RF source 126. The RF source 126 may be referred to as a bias RF source in that the RF source 126 is configured to provide or supply an RF or alternating current to the electrode 124 to bias the electrode 124. The electrode 124 may be biased to increase or decrease the strength of attraction of the ions (e.g., argon ions or other types of ions) in the plasma 106 to the electrode 124, which may be used to increase or decrease the etch rate of a wafer. The RF source 126 may connect to an electrical ground 128 and may be an RF power supply or another type of device that is capable of generating and providing/supplying an RF current in a suitable frequency range such as approximately 10 MHz to approximately 30 MHz or approximately 300 MHz to approximately 300 GHz, among other examples.

As further shown in FIG. 1, a chuck 130 may be included in the processing chamber 102 above and/or on the electrode 124. The chuck 130 may be an electrostatic chuck (e-chuck or ESC) or another type of chuck (e.g., a vacuum chuck) that is configured to hold and/or secure a wafer in the processing chamber 102 during processing (e.g., plasma etching) of the wafer. Moreover, a focus ring 132 may be included in the processing chamber 102 above and/or on a portion of the electrode 124, and surrounding the chuck 130. The focus ring 132 may be configured to focus the plasma 106 toward a wafer on the chuck 130 by directing (or redirecting) at least a portion of the plasma 106 toward the wafer.

The number and arrangement of components shown in FIG. 1 are provided as an example. The plasma-based semiconductor processing tool 100 may include additional components, fewer components, different components, or differently arranged components than those shown in FIG. 1. Additionally, or alternatively, a set of components (e.g., one or more components) of the plasma-based semiconductor processing tool 100 may perform one or more functions described as being performed by another set of components of the plasma-based semiconductor processing tool 100.

Figure 2A:
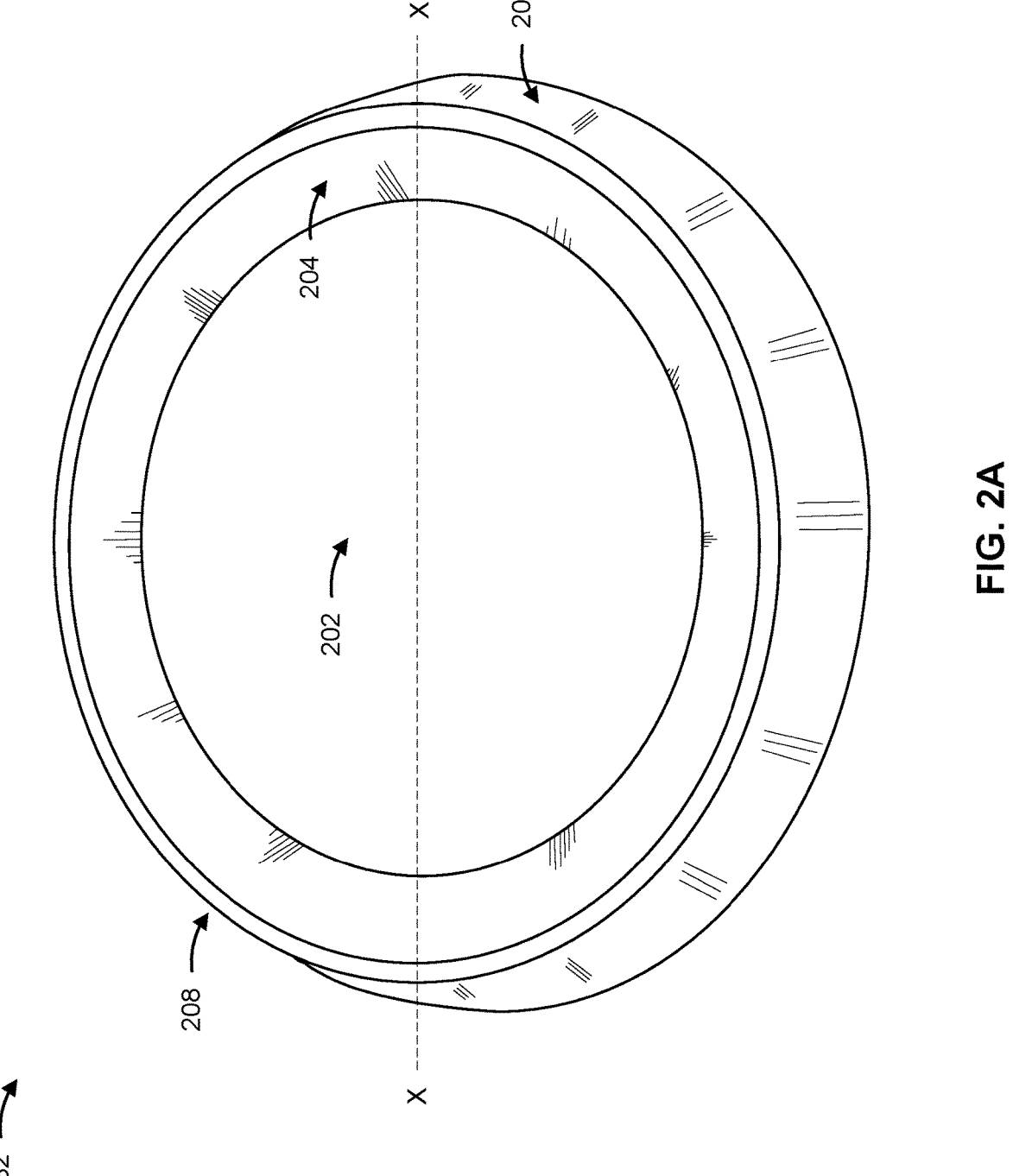
FIGS. 2A and 2B are diagrams of an example focus ring for use in the plasma-based semiconductor processing tool of FIG. 1.
Figure 2B:
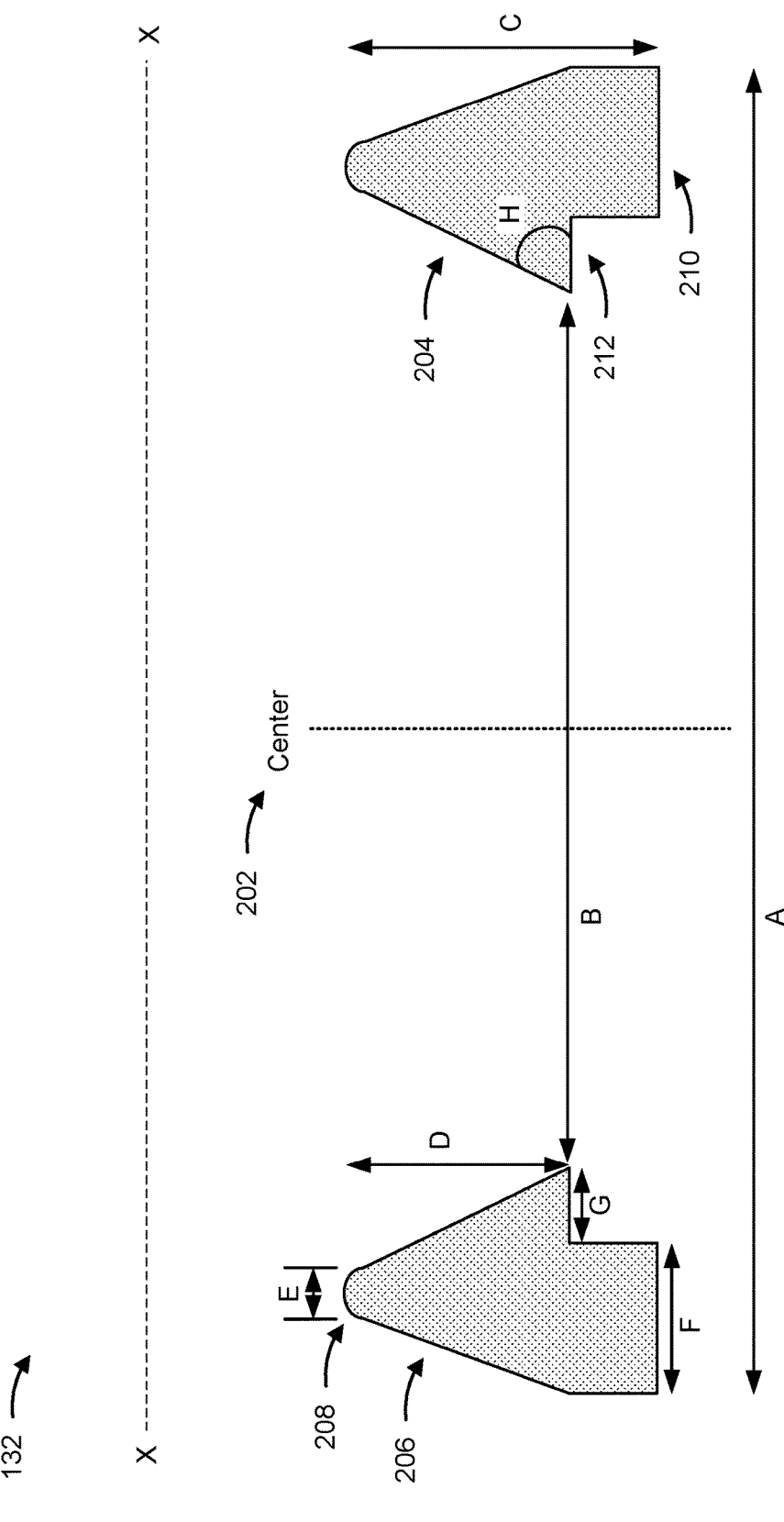

FIGS. 2A and 2B are diagrams of the example focus ring 132 for use in the plasma-based semiconductor processing tool 100 of FIG. 1. In particular, FIG. 2A is a perspective view of the focus ring 132, and FIG. 2B is a cross-sectional view along line XX of FIG. 2A.

As shown in FIG. 2A, the focus ring 132 may have a generally ring-shaped structure with a hollow or open center 202 to permit a wafer to be placed in the open center 202. The structure of the focus ring 132 may include an inner wall 204 and an outer wall 206 connected by a top surface 208. The inner wall 204 may be configured to direct or redirect plasma (e.g., plasma 106) toward a wafer that is positioned in the open center 202. In particular, the inner wall 204 may be an angled or tapered inner wall that is angled away from the open center 202 such that the angle of the inner wall 204 causes plasma to be reflected off of the inner wall 204 and toward the open center 202. The inner wall 204 may be angled away from the open center 202 along the circumference of the focus ring 132 at a uniform angle along the circumference to promote uniform distribution of plasma across the wafer placed in the open center 202.

The outer wall 206 may be a straight wall, may be an angled wall, or may be a non-uniform wall having a straight portion and an angled portion. In some implementations, the outer wall 206 is angled inward toward the inner wall 204 and the open center 202. In some implementations, the outer wall 206 is angled outward in a similar manner as the inner wall 204 (at the same angle or a different angle). The top surface 208 of the focus ring 132 may be flat or may be curved, round, or semi-circular such that the top surface 208 is convex.

As shown in FIG. 2B, the focus ring 132 may include additional surfaces, such as a bottom surface 210 that is configured to rest on the electrode 124 or the bottom surface of the processing chamber 102, and a lower surface 212 that is configured to rest on at least a portion of the chuck 130. The bottom surface 210 may be adjacent to, may connect to, and may be orthogonal to at least a portion of the outer wall 206. The lower surface 212 may be above the bottom surface 210, and may be adjacent to, and may connect to the inner wall 204. The inner wall 204, the outer wall 206, and the top surface 208 may be located above the bottom surface 210. The inner wall 204, at least a portion of the outer wall 206, and the top surface 208 may be located above the lower surface 212.

As further shown in FIG. 2B, the structures or portions of the focus ring 132 may be formed to various dimensions. The focus ring 132 may have an outer diameter A across the outer wall 206 of the focus ring 132 and an inner diameter B across the inner wall 204 (e.g., from a first point of the inner wall 204 to second point of the inner wall 204 across the open center 202) of the focus ring 132. In some implementations, the outer diameter A is within a range of approximately 285 millimeters to approximately 287 millimeters. In some implementations, the inner diameter B is within a range of approximately 209 millimeters to approximately 214 millimeters. In some implementations, the outer diameter A and/or the inner diameter B may be different for different sizes of wafers. For example, the focus ring 132 may be configured for use with 200 millimeter wafers, and the inner diameter B is within a range of approximately 209 millimeters to approximately 214 millimeters.

The outer wall 206 may have a height C and the inner wall 204 may have a height D. In some implementations, the height C of the outer wall 206 is greater than the height D of the inner wall 204. In some implementations, the height C of the outer wall 206 is in a range of approximately 61 millimeters to approximately 63 millimeters. In some implementations, the height D of the inner wall 204 is in a range of approximately 19 millimeters to approximately 24 millimeters.

The top surface 208 may have a width E. In some implementations, the width E is less than approximately 10 millimeters. The bottom surface 210 may have a width F. In some implementations, the width F is in a range of approximately 19 millimeters to approximately 21 millimeters. The lower surface 212 may have a width G. In some implementations, the width G is in a range of approximately 16 millimeters to approximately 18 millimeters. As indicated above, the inner wall 204 may be angled away and/or outwardly from the open center 202 of the focus ring 132. In some implementations, the outward angle H of the inner wall 204 relative to the lower surface 212 is less than 50 degrees.

One or more of the dimensions of the focus ring 132 may promote, increase, ensure, and/or otherwise provide uniformity of a flow of the plasma toward a wafer that is positioned within the open center 202 of the focus ring 132. As an example, for a 200 mm wafer, the combination of the inner diameter B of the focus ring 132 being within a range of approximately 209 millimeters to approximately 214 millimeters and the outward angle H of the inner wall 204 being less than approximately 50 degrees may increase uniformity of plasma flow toward a wafer by reducing and/or minimizing the amount of plasma overlap at or near the center of the wafer. In this way, the inner diameter B of the focus ring 132 being within a range of approximately 209 millimeters to approximately 214 millimeters and the outward angle H of the inner wall 204 being less than approximately 50 degrees may increase the uniformity of an etch rate of the wafer in that the above-described dimensions may be capable of substantially achieving uniformity of the etch rate between an inner portion of the wafer and an outer portion of the wafer.

The focus ring 132 may be formed of a ceramic material or another suitable insulating material by various manufacturing devices and/or tools. For example, the manufacturing devices and/or tools may be used to form the bottom surface 210, the lower surface 212, the inner wall 204, the outer wall 206, and the top surface 208. In some implementations, the manufacturing devices and/or tools form the lower surface 212 and the inner wall 204 such that the inner diameter B of the plasma focus ring 132 is in a range of approximately 209 millimeters to approximately 214 millimeters. In some implementations, the manufacturing devices and/or tools form the lower surface 214 and the inner wall 204 such that the inner wall 204 is angled away from the open center 202 of the plasma focus ring 132 at an angle H less than 50 degrees relative to the lower surface 212. In some implementations, the manufacturing devices and/or tools form the top surface 208 such that the width E of the top surface 208 is less than approximately 10 millimeters. In some implementations, the manufacturing devices and/or tools include a plurality of ceramic processing devices, such as a batching device that mixes or blends various ceramic powders together with binders and other additives to form a mixture, a molding or casting device that pours or injects the mixture into a mold, a drying device that dries the mixture in the mold to remove water and moisture, and a firing device that sinters the mixture to form the focus ring 132.

As indicated above, FIGS. 2A and 2B are provided as an example. Other examples may differ from what is described with regard to FIGS. 2A and 2B.

Figure 3:
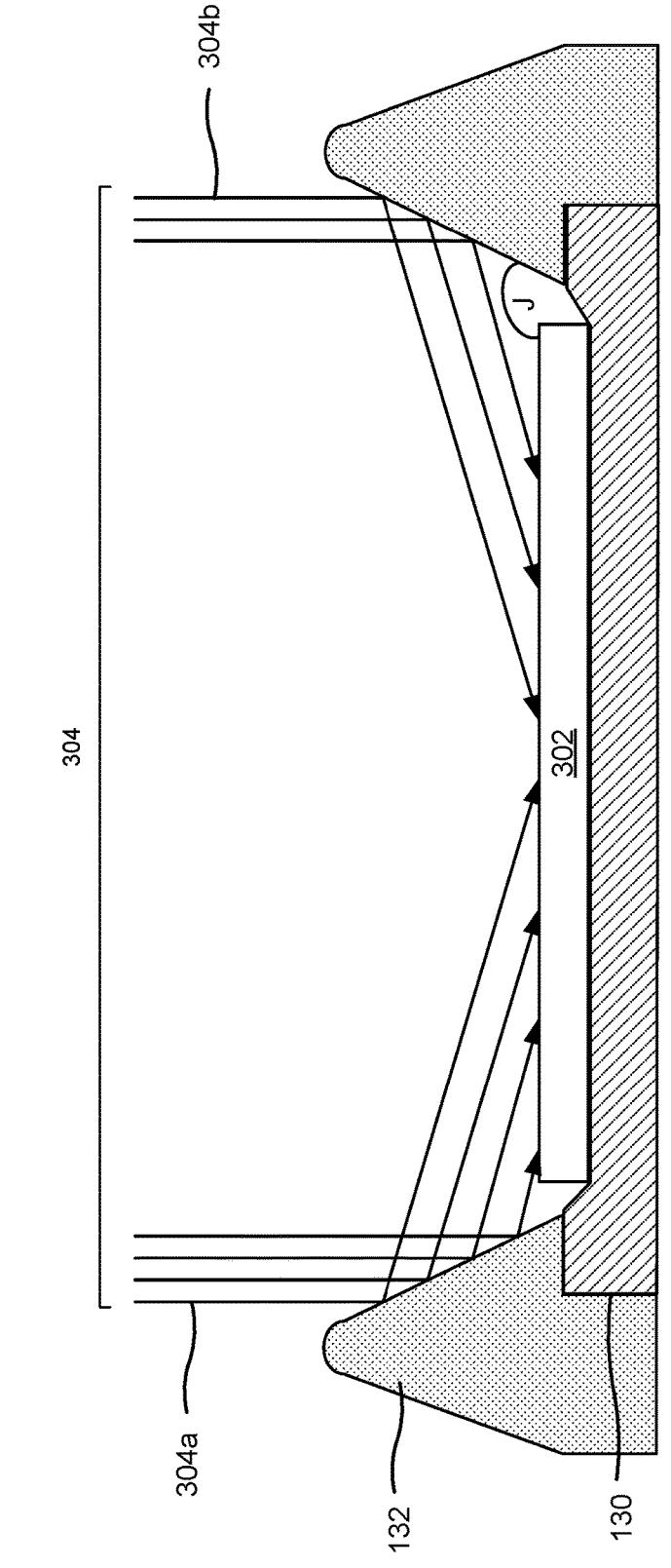
FIG. 3 is a diagram of an example implementation described herein.

FIG. 3 is a diagram of an example implementation 300 described herein. As shown in FIG. 3, the focus ring 132 may be placed on and/or around the chuck 130. Moreover, a wafer 302 may be placed on the chuck 130 such that the focus ring 132 surrounds the wafer 302. The focus ring 132, the chuck 130, and the wafer 302 may be placed in a processing chamber of a plasma-based semiconductor processing tool, such as the processing chamber 102 of the plasma-based semiconductor processing tool 100.

As further shown in FIG. 3, a plasma 304 may be supplied to the wafer 302 to etch the wafer 302 and/or one or more layers included thereon. Some of the plasma 304 may be supplied directly to the wafer 302. Other portions of the plasma 304 may be supplied to the wafer 302 by being redirected toward the wafer 302 by the focus ring 132. For example, portion 304a of the plasma 304 may be redirected toward a first side of wafer 302 by a first portion of the focus ring 132, and another portion 304b of the plasma 304 may be redirected toward a second side of wafer 302 by a second portion of the focus ring 132 on an opposite side of the focus ring 132.

As further shown in FIG. 3, the angle of the inner wall 204 of the focus ring 132, the inner diameter of the focus ring 132, and/or the width of the upper surface 208 of the focus ring 132 may be configured to reduce, minimize, and/or eliminate overlapping areas of plasma 304 redirected toward the wafer 302 by the focus ring 132 (e.g., such that portion 304a does not overlap with portion 304b). This promotes uniformity of plasma density (and thus, uniformity of the etch rate) across the wafer 302, particularly from an inner portion toward the center of the wafer 302 (e.g., an inner 90-100 millimeters of the area of the wafer 302) to an outer portion toward an outer edge of the wafer 302 (e.g., an outer 90-100 millimeters of the area of the wafer 302). For example, the angle of the inner wall 204 relative to a top planar surface of the wafer 302 (indicated in FIG. 3 as angle J) may be configured to be greater than approximately 130 degrees and/or the angled of the inner wall 204 relative to the lower surface 212 may be configured to be less than approximately 50 degrees (indicated in FIG. 2B as angle H). As another example, the inner diameter of the focus ring may be configured to be within a range of approximately 209 millimeters to 214 millimeters where the wafer 302 is a 200 millimeter wafer.

The combination of the angle of the inner wall 204 relative to the lower surface 212 being less than approximately 50 degrees (indicated in FIG. 2B as angle H) and the inner diameter of the focus ring 132 being in a range of approximately 209 millimeters to 214 millimeters may reduce, minimize, and/or eliminate the overlap of plasma portion 304*a* and plasma portion 304*b* at or near a center of the wafer 302. In particular, the angle of the inner wall 204 relative to the lower surface 212 being less than approximately 50 degrees (indicated in FIG. 2B as angle H) and the inner diameter of the focus ring 132 being in a range of approximately 209 millimeters to 214 millimeters reduces or eliminates plasma from being directed across the center of the wafer 302 and to the other side of the wafer 302, which would otherwise overlap on the other side of the wafer 302 with plasma directed by other portions of the focus ring 132. In some cases, if the angle of the inner wall 204 relative to the lower surface 212 is greater than approximately 50 degrees (e.g., 60 degrees, 70 degrees), the plasma portion 304*a* and the plasma portion 304*b* might overlap at or near the center of the wafer 302, which would cause the etch rate at or near the center of the wafer 302 to be greater than the etch rate at or near an edge of the wafer 302. Accordingly, the combination of the angle of the inner wall 204 relative to the lower surface 212 being less than approximately 50 degrees and the inner diameter of the focus ring 132 being in a range of approximately 209 millimeters to 214 millimeters may increase the uniformity of the etch rate across the wafer 302 from the center of the wafer 302 to the edge of the wafer 302.

The diagram of FIG. 3 is a cross-sectional view, and it should be understood that portions of the plasma 304 are redirected toward the wafer 302 along the circumference of the focus ring 132 in a similar manner as shown in FIG. 3.

As indicated above, FIG. 3 is provided as an example. Other examples may differ from what is described with regard to FIG. 3.

Figure 4:
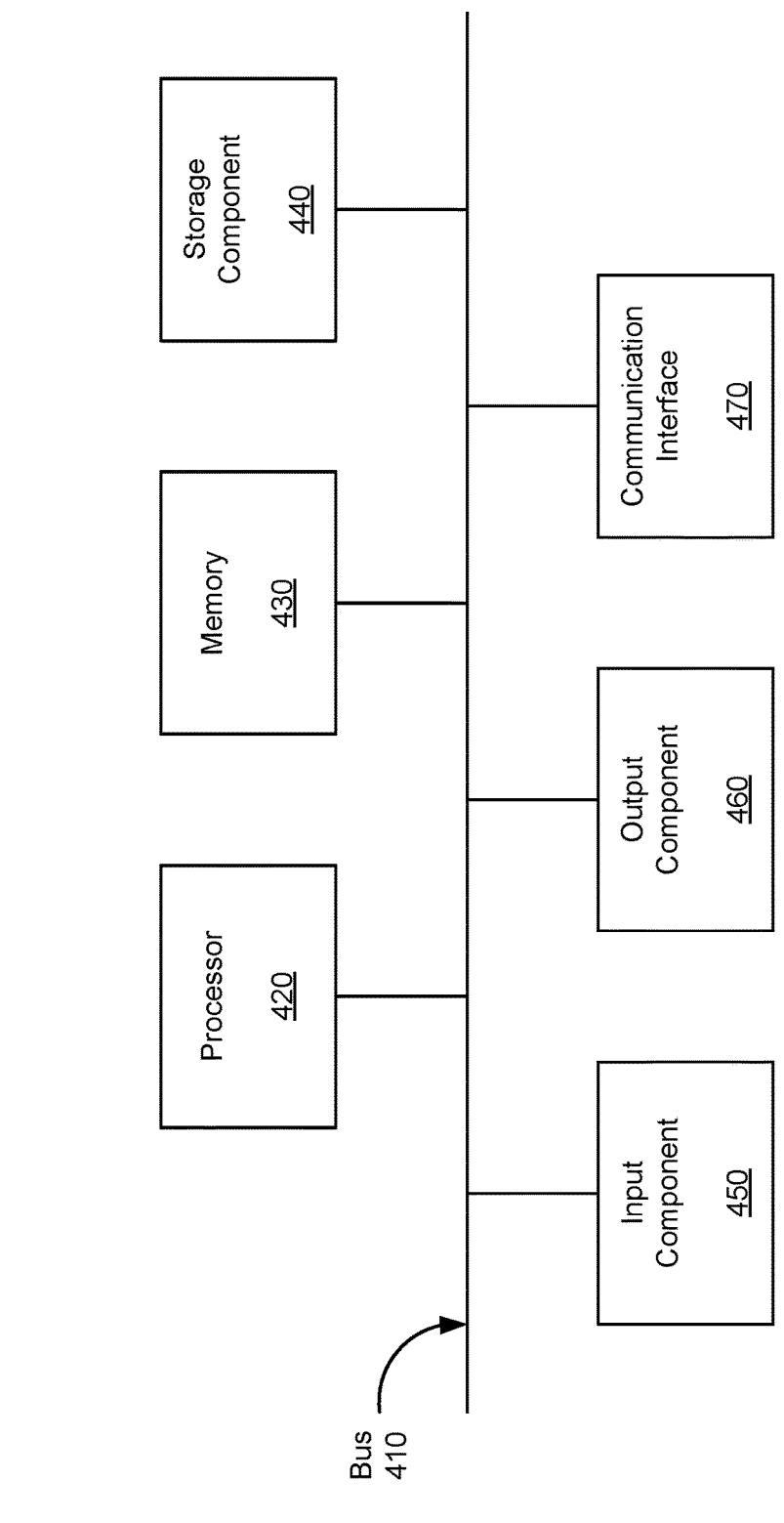
FIG. 4 is a diagram of example components of one or more devices of FIG. 1.

FIG. 4 is a diagram of example components of a device 400. In some implementations, the plasma-based semiconductor processing tool 100 and/or one or more devices that form the focus ring 132 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

FIG. 5 is a flowchart of an example process 500 associated with forming a focus ring for a plasma-based semiconductor processing tool. In some implementations, one or more process blocks of FIG. 5 may be performed by a device (e.g., device 400). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include forming a bottom surface of a plasma focus ring (block 510). For example, the device may form a bottom surface 210 of a plasma focus ring 132, as described above.

As further shown in FIG. 5, process 500 may include forming a lower surface of the plasma focus ring above the bottom surface such that an inner diameter of the plasma focus ring is in a range of approximately 209 millimeters to approximately 214 millimeters (block 520). For example, the device may form a lower surface 212 of the plasma focus ring 132 above the bottom surface 210 such that an inner diameter B of the plasma focus ring 132 is in a range of approximately 209 millimeters to approximately 214 millimeters, as described above.

As further shown in FIG. 5, process 500 may include forming an angled inner wall of the plasma focus ring above the bottom surface and adjacent to the lower surface such that the angled inner wall is angled away from a center of the plasma focus ring at an angle less than 50 degrees relative to the lower surface (block 530). For example, the device may form an angled inner wall 204 of the plasma focus ring 132 above the bottom surface 210 and adjacent to the lower surface 212 such that the angled inner wall 204 is angled away from a center 202 of the plasma focus ring 132 at an angle less than 50 degrees relative to the lower surface 212, as described above.

Process 500 may include additional implementations, such as any single implementation or any combination of implementations described below and/or in connection with one or more other processes described elsewhere herein.

In a first implementation, process 500 includes forming a top surface 208 of the plasma focus ring 132 above and connected to the angled inner wall 204, and forming an outer wall 206 of the plasma focus ring 132 connected to the top surface 208 and the bottom surface 210. In a second implementation, alone or in combination with the first implementation, forming the top surface 208 includes forming the top surface 208 to a width of less than approximately 10 millimeters. In a third implementation, alone or in combination with one or more of the first or second implementations, the focus ring 132 may be formed of a ceramic material. In a fourth implementation, alone or in combination with one or more of the first through third implementations, the device that forms the focus ring 132 includes a plurality of ceramic processing devices, such as a batching device that mixes or blends various ceramic powders together with binders and other additives to form a mixture, a molding or casting device that pours or injects the mixture into a mold, a drying device that dries the mixture in the mold to remove water and moisture, and a firing device that sinters the mixture to form the focus ring 132.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with etching a wafer using a focus ring in a plasma-based semiconductor processing tool. In some implementations, one or more process blocks of FIG. 6 may be performed by a plasma-based semiconductor processing tool (e.g., plasma-based semiconductor processing tool 100). Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include generating a plasma using a plasma source of the plasma-based semiconductor processing tool (block 610). For example, the plasma-based semiconductor processing tool 100 may generate the plasma 106 using the plasma source 104 of the plasma-based semiconductor processing tool 100, as described above.

As further shown in FIG. 6, process 600 may include providing, using the plasma source, the plasma to a processing chamber of the plasma-based semiconductor processing tool (block 620). For example, the plasma-based semiconductor processing tool 100 may provide, using the plasma source 104, the plasma 106 to the processing chamber 102 of the plasma-based semiconductor processing tool 100, as described above.

As further shown in FIG. 6, process 600 may include directing, using a focus ring in the processing chamber, at least a portion of the plasma toward a wafer in the processing chamber (block 630). For example, the plasma-based semiconductor processing tool 100 may direct, using the focus ring 132 in the processing chamber 102, at least a portion of the plasma 106 toward a wafer (e.g., wafer 302) in the processing chamber 102, as described above.

As further shown in FIG. 6, process 600 may include etching the wafer with the plasma using the plasma-based semiconductor processing tool, where an inner diameter of the focus ring and an outward angle of an angled inner wall of the focus ring are configured to provide etching uniformity across the wafer during etching of the wafer (block 640). For example, the plasma-based semiconductor processing tool 100 may etch the wafer with the plasma 106, as described above. In some implementations, the inner diameter B of the focus ring 132 and outward angle (e.g., angle H and/or angle J) of the angled inner wall 204 of the focus ring 132 are configured to provide etching uniformity across the wafer during etching of the wafer.

Process 600 may include additional implementations, such as any single implementation or any combination of implementations described below and/or in connection with one or more other processes described elsewhere herein.

In a first implementation, the outward angle of the angled inner wall 204 of the focus ring 132, relative to a surface of the wafer that is to be etched (e.g., outward angle J), is greater than approximately 130 degrees. In a second implementation, alone or in combination with the first implementation, the inner diameter B of the focus ring 132 is in a range of approximately 209 millimeters to approximately 214 millimeters. In a third implementation, alone or in combination with one or more of the first or second implementations, the outward angle of the angled inner wall 204 of the focus ring 132, relative to a lower surface 212 of the focus ring 132 (e.g., outward angle H), is less than approximately 50 degrees.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a focus ring 132 for a plasma-based semiconductor processing tool 100 is designed to provide and/or ensure etch rate uniformity across a wafer during a plasma etch process. The focus ring 132 may include an angled inner wall 204 that is angled away from a center 202 of the focus ring 132 to direct a plasma 106 toward the wafer. The angle of the angled inner wall 204 may be greater than approximately 130 degrees relative to the top surface of the wafer and/or may be less than approximately 50 degrees relative to an adjacent lower surface 212 of the focus ring 132 to reduce and/or eliminate areas of overlapping plasma on the wafer (which would otherwise cause non-uniform etch rates). Moreover, an inner diameter may be configured to be in a range of approximately 209 millimeters to 214 millimeters to further reduce and/or eliminate areas of overlapping plasma on the wafer. In this way, the focus ring 132 provides and/or increases etch rate uniformity across the wafer, which may reduce structural variations across semiconductor devices being formed on the wafer and/or may increase processing yield.

As described in greater detail above, some implementations described herein provide a focus ring for a plasma-based semiconductor processing tool. The focus ring includes an angled inner wall angled away from a center of the focus ring. The focus ring includes a lower surface adjacent to the angled inner wall. An outward angle of the angled inner wall is configured to reduce overlap of a plasma at or near a center of a wafer and to reduce areas of the wafer that are not etched by the plasma. The focus ring includes a top surface connecting the outer wall and the angled inner wall.

As described in greater detail above, some implementations described herein provide a plasma-based semiconductor processing tool. The plasma-based semiconductor processing tool includes a processing chamber, a plasma source to generate a plasma in the processing chamber, and a focus ring to direct at least a portion of the plasma in the processing chamber. An inner wall of the focus ring is angled outward from a center of the focus ring. An inner diameter of the focus ring and an outward angle of the inner wall are configured to provide uniformity of an etch rate of plasma that is directed toward a wafer in the processing chamber.

As described in greater detail above, some implementations described herein provide a method. The method includes forming a bottom surface of a plasma focus ring. The method includes forming a lower surface of the plasma focus ring above the bottom surface such that an inner diameter of the plasma focus ring is in a range of approximately 209 millimeters to approximately 214 millimeters. The method includes forming an angled inner wall of the plasma focus ring above the bottom surface and adjacent to the lower surface such that the angled inner wall is angled away from a center of the plasma focus ring at an angle less than 50 degrees relative to the lower surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a bottom surface of a plasma focus ring, wherein the bottom surface resides entirely on a same plane;
forming a lower surface of the plasma focus ring above the bottom surface such that an inner diameter of the plasma focus ring is in a range of approximately 209 millimeters to approximately 214 millimeters, wherein a straight inner wall of the plasma focus ring intersects with the bottom surface and the lower surface;
forming an angled inner wall of the plasma focus ring above the bottom surface and intersecting with the lower surface such that the angled inner wall is angled away from a center of the plasma focus ring at an angle less than 50 degrees relative to the lower surface;
forming an angled outer wall of the plasma focus ring residing entirely at or above the lower surface and intersecting with a straight outer wall, wherein at least one of:
a width of the bottom surface is in a range of approximately 19 millimeters to approximately 21 millimeters,
a width of the lower surface is in a range of approximately 16 millimeters to approximately 18 millimeters, or
a height of the angled inner wall is in a range of approximately 19 millimeters to approximately 24 millimeters; and
forming a curved top surface of the plasma focus ring intersecting with the angled inner wall and the angled outer wall.

2. The method of claim 1,
wherein forming the curved top surface comprises:
forming the curved top surface to have a width of less than approximately 10 millimeters.

3. The method of claim 1,
wherein the bottom surface is orthogonal with the straight outer wall.

4. The method of claim 1,
wherein the height of the angled inner wall is approximately equal to a height of the angled outer wall.

5. The method of claim 1, further comprising:
placing the plasma focus ring on and around a chuck.

6. The method of claim 5,
wherein a bottom surface of the chuck resides on the same plane as the bottom surface.

7. The method of claim 6,
wherein the lower surface of the plasma focus ring resides on a portion of a top surface of the chuck, and wherein a sidewall of the chuck interfaces directly with the straight inner wall.

8. The method of claim 1,
wherein a height of the straight inner wall is approximately equal to a height of the straight outer wall.

9. A method, comprising:
forming a bottom surface of a focus ring, wherein the bottom surface resides entirely on a same plane;
forming a lower surface of the focus ring above the bottom surface and adjacent to an open center of the focus ring, wherein a straight inner wall of the focus ring intersects with the bottom surface and the lower surface;
forming an angled inner wall of the focus ring above the bottom surface and adjacent to the lower surface such that the angled inner wall is structured to direct or redirect plasma to the open center of the focus ring;
forming an angled outer wall of the focus ring residing entirely at or above the lower surface and intersecting with a straight outer wall; and
forming a curved top surface of the focus ring intersecting with the angled inner wall and the angled outer wall, wherein a width of the curved top surface is less than approximately 10 millimeters,
wherein at least one of:
a width of the bottom surface is in a range of approximately 19 millimeters to approximately 21 millimeters,
a width of the lower surface is in a range of approximately 16 millimeters to approximately 18 millimeters, or
a height of the angled inner wall is in a range of approximately 19 millimeters to approximately 24 millimeters.

10. The method of claim 9, wherein the angled inner wall is angled away from the open center of the focus ring at a uniform angle along a circumference of the focus ring.

11. The method of claim 9, wherein the angled inner wall defines the open center of the focus ring.

12. The method of claim 9, wherein the angled inner wall is above the lower surface.

13. The method of claim 9, wherein the angled inner wall intersects with the lower surface.

14. A method, comprising:

forming a bottom surface of a plasma focus ring, wherein the bottom surface resides entirely on a same plane;

forming a lower surface of the plasma focus ring above the bottom surface, wherein a straight inner wall of the plasma focus ring intersects with the bottom surface and the lower surface;

forming an angled inner wall of the plasma focus ring above the bottom surface and intersecting with the lower surface;

forming an outer wall of the plasma focus ring above the bottom surface and intersecting with the angled inner wall;

forming an angled outer wall of the plasma focus ring residing entirely at or above the lower surface and intersecting with a straight outer wall, wherein at least one of:

a width of the bottom surface is in a range of approximately 19 millimeters to approximately 21 millimeters, a width of the lower surface is in a range of approximately 16 millimeters to approximately 18 millimeters, or a height of the angled inner wall is in a range of approximately 19 millimeters to approximately 24 millimeters; and forming a curved top surface of the plasma focus ring intersecting with the angled inner wall and the angled outer wall.

15. The method of claim 14, wherein the angled inner wall intersects with the lower surface.

16. The method of claim 14, wherein the outer wall comprises at least one of an angled portion or a straight portion.

17. The method of claim 14, further comprising:

placing the plasma focus ring on and around a chuck.

18. The method of claim 17, wherein a bottom surface of the chuck resides on the same plane as the bottom surface.

19. The method of claim 18, wherein the lower surface of the plasma focus ring resides on a portion of a top surface of the chuck, and wherein a sidewall of the chuck interfaces directly with the straight inner wall.

20. The method of claim 14, wherein a height of the straight inner wall is approximately equal to a height of the straight outer wall, and wherein the height of the straight inner wall is less than each of a height of the angled inner wall and the height of the angled outer wall.

\* \* \* \* \*